(12) United States Patent
Redecker et al.

(10) Patent No.: US 7,015,501 B2
(45) Date of Patent: Mar. 21, 2006

(54) SUBSTRATE AND ORGANIC ELECTROLUMINESCENCE DEVICE USING THE SUBSTRATE

(75) Inventors: Michael Redecker, Berlin (DE); Marcus Schaedig, Berlin (DE); Michael Kubiak, Berlin (DE)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/627,683

(22) Filed: Jul. 28, 2003

(65) Prior Publication Data

US 2004/0079940 A1    Apr. 29, 2004

(30) Foreign Application Priority Data

Aug. 2, 2002   (DE)   ................................ 102 36 404
Mar. 13, 2003  (KR)   ....................... 10-2003-0015598

(51) Int. Cl.
*H01L 35/24* (2006.01)
(52) U.S. Cl. ................. 257/40; 257/E51.022; 257/643; 257/791; 257/792; 313/504
(58) Field of Classification Search ................ 257/40, 257/676, 642, 643, 791, 792, 794, E25.032, 257/E51.022, E21.007, E21.024, E21.254, 257/E21.299, E23.018; 313/504
See application file for complete search history.

(56) References Cited

U.S. PATENT DOCUMENTS

| | | | |
|---|---|---|---|
| 2003/0148024 A1* | 8/2003 | Kodas et al. ................ 427/125 |
| 2003/0171060 A1* | 9/2003 | Hirano et al. ................ 445/24 |
| 2004/0009673 A1* | 1/2004 | Sreenivasan et al. ........ 438/694 |
| 2004/0175646 A1* | 9/2004 | Hatanaka et al. ......... 430/270.1 |

* cited by examiner

*Primary Examiner*—Nathan J. Flynn
*Assistant Examiner*—Scott R. Wilson
(74) *Attorney, Agent, or Firm*—H.C. Park & Associates, PLC

(57) ABSTRACT

A substrate and an organic electroluminescence device employing the substrate are provided. The substrate has at least one non-continuous photo-resist coating layer formed on at least one surface of a supporting substrate and the non-continuous photo-resist coating has a plurality of continuous portions. The continuous portions may have high surface energy areas and low surface energy areas. A second photo-resist coating layer is used to at least temporarily overlap the continuous portion which corresponds to the high surface energy area in order to form the low surface energy area.

12 Claims, 4 Drawing Sheets

5  3  2

SUBSTRATE AND ORGANIC ELECTROLUMINESCENCE DEVICE USING THE SUBSTRATE

This application claims the benefit of German Patent Application No. 102 36 404.4 filed on Aug. 2, 2002 and Korean Patent Application No. 10-2003-0015598, filed on Mar. 13, 2003, which are hereby incorporated by reference for all purposes as if fully set forth herein.

BACKGROUND OF THE INVENTION

1. Field of the Invention

This invention relates to a substrate and an organic electroluminescence device using the substrate, and more particularly, to a substrate with a plurality of surface energies which can be manufactured at low cost and with a thinner coating than conventional substrates, and an organic electroluminescence device using the substrate.

2. Description of the Related Art

An inkjet printing process is an important structuring process for the manufacture of full-color displays using light-emitting polymers (LEPs). In the inkjet printing process, a small amount of a polymer solution is deposited onto a suitable substrate. The spatial dissolution of the polymer solution is predominantly influenced by the surface characteristics of the substrate. To avoid color mixing of the so called "pixel surface", wetting using deposited polymer ink should be carried out only in a zone which is envisioned for a light-emitting pixel.

Areas of a substrate surface with a high surface energy allow ink for printing to flow, whereas areas with a low surface energy act as a barrier to ink flow. To obtain a film having a homogenous coating thickness, it is advantageous for a portion of the substrate beyond a boundary of a pixel surface of an organic light-emitting diode (OLED) to have a high surface energy. If the portion of the substrate beyond the boundary of the pixel surface has a high surface energy, the formed film has a homogenous thickness up to the boundary and the coating thickness noticeably declines outside an active zone in the vicinity of the barrier.

A desired contrast in surface energy can be achieved in different ways and by different methods.

One known approach is described in the EP 0989778 A1. In this approach, a substrate surface with a contrast of surface energies is formed by means of a suitable selection of materials for forming the substrate surface.

EP 0989778 A1, for example, describes a two-coating structure of a surface. By means of a suitable plasma surface treatment, an upper coating can be provided with a low surface energy while a lower coating, because of its chemical nature, receives a high surface energy with the same treatment. The lower coating is typically manufactured from inorganic materials such as silicon oxide/nitride.

In this approach, the inorganic coating acts as a boundary zone with a high surface energy and facilitates the deposition of homogenous polymer films by means of inkjet printing. However, for deposition and structuring of inorganic coatings, various processes typically used in the semi-conductor industry should be performed. For example, to attain the inorganic coatings, separation, sputter processes and gas phase processes such as PECVD (Plasma Enhanced Chemical Vapor Deposition) may be used.

However, these processes are expensive, and thus reduce the cost efficiency that can be gained by using OLED technology. Moreover, the second coating layer has a surface topography such that the areas with low surface energy (hereinafter called "separators") are spaced apart a predetermined height from the substrate surface. As a result of this height profile, the separated polymer film can form an undesirable thickness profile.

JP09203803, for example, describes a chemical treatment on a substrate surface having a photo-resist formed thereon. The photo-resist is exposed using a mask and then developed. In the resulting structure, the areas with the photo-resist have a low surface energy while areas without the photo-resist have a high surface energy. The flanks of the photo-resist structure have a mean surface energy, and thus can avoid an abrupt transition in surface energy to a certain degree. However, the flanks do not represent a boundary zone with a freely selectable surface energy and geometry because the spatial dissolution capacity of the inkjet printing process disadvantageously declines through areas with a mean surface energy.

JP09230129, for example, describes a two-stage treatment on a substrate surface. Initially, the substrate surface has a low surface energy, but the surface energy gradually increases at a predetermined portion of the surface which is treated with short-wavelength light. However, according to this method, contrast of a surface energy is limited and an exposure time is prolonged, making mass production difficult.

SUMMARY OF THE INVENTION

The present invention provides, for example, a substrate with a coating which is thinner than conventional coatings and with a good spatial dissolution capacity for ink-jet printing, which can be manufactured at low cost, a manufacturing method of the substrate, an organic electroluminescence device using the substrate and a manufacturing method of the organic electroluminescence device. The substrate according to this invention has a plurality of comparatively different surface energies, such as, for example, at least one region with a low surface energy and at least one region with a comparatively high surface energy.

This invention provides a method for manufacturing a substrate by depositing a first photo-resist coating material on a supporting substrate, exposing the first photo-resist coating material using a mask, developing the first photo-resist coating material to provide a first photo-resist coating layer; treating with a first treatment the first photo-resist coating layer to adjust a surface energy of the first photo-resist coating layer, depositing a second photo-resist coating material on at least a portion of the first photo-resist coating layer, exposing the second photo-resist coating material using a mask, developing the second photo-resist coating material to provide a second photo-resist coating layer, wherein at least a portion of the second photo-resist coating layer overlaps at least a portion of the first photo-resist coating layer, treating with a second treatment at least one portion of the first photo-resist coating layer, and removing the second photo-resist coating layer.

In various exemplary embodiments of the devices and methods according to this invention, the first photo-resist coating layer may be provided with a high surface energy by using, for example, an UV-ozone treatment or an oxygen-plasma treatment. The surface energy of at least a portion of a surface may be reduced in the various exemplary embodiments according to this invention by using a plasma treatment which includes, for example, a fluorine-containing gas mixture where the fluorine-containing gas mixture is, for example, at least one of $CF_4$, $SF_6$ and $NF_3$.

This invention separately provides reducing the surface energy of a surface using a plasma treatment which includes a gas mixture of tetrafluoromethane and oxygen in the volume ratio 4:1.

In various exemplary embodiments of the devices and methods according to this invention, the first photo-resist coating material and the second photo-resist coating material are at least one of a Novolak based photo-resist on, acrylic lacquer, epoxy lacquer and polyimide lacquer.

In various exemplary embodiments of the devices and methods and according to this invention, the second photo-resist coating is removed by using, for example, at least one of acetone and tetrahydrofuran.

This invention separately provides a substrate having at least one non-continuous photo-resist coating layer formed on at least one surface of a supporting substrate, wherein the at least one non-continuous photo-resist coating layer comprises a plurality of continuous portions, and the plurality of continuous portions comprise at least one high surface energy area, and at least one low surface energy area, wherein a second photo-resist coating layer is used to at least temporarily overlap the continuous portion corresponding to the at least one high surface energy area in order to form the at least one low surface energy area.

This invention provides a substrate which has at least one high surface energy area and at least one low surface energy area where the surface energy of the high surface energy is about 60–70 dyne/cm and the surface energy of the low surface energy area is about 20–35 dyne/cm.

This invention provides a substrate having a supporting substrate which may be rigid or flexible.

This invention provides a substrate having a supporting substrate which is made, for example, of glass, plastic or silicon.

This invention provides a substrate having a photo-resist coating material which is at least one selected from the group consisting of a Novolak based photo-resist, acrylic lacquer, epoxy lacquer and polyimide lacquer.

This invention separately provides a method of manufacturing an organic electroluminescence device comprising depositing a first photo-resist coating material on a supporting substrate, exposing and developing the first photo-resist coating material to provide a first photo-resist coating layer, treating with a first treatment at least one surface of the first photo-resist coating layer to adjust a surface energy of the first photo-resist coating layer, depositing a second photo-resist coating material on at least a portion of the first photo-resist coating layer, exposing and developing the second photo-resist coating material to provide a second photo-resist coating layer, wherein at least a portion of the second photo-resist coating layer overlaps at least a portion of the first photo-resist coating layer, treating with a second treatment at least one portion of the first photo-resist coating layer not overlapped by the second photo-resist layer, removing the second photo-resist coating layer, and supplying an ink drop containing an organic layer forming material to the resultant structure to form an organic layer.

This invention separately provides a method for manufacturing an organic electroluminescence device in which the organic layer forming material is at least one selected from the group consisting of a conductive polymer and a light-emitting polymer. In the various exemplary embodiments of this invention, the conductive polymer is at least one of polyethylene dioxothiophene—polystyrene sulfone acid, polyaniline and a mixture thereof.

This invention separately provides a method for manufacturing an organic electroluminescence device in which the surface tension of the conductive polymer is reduced using at least one of a surfactant and a lower alcohol. The lower alcohol may be, for example, one of butanol and propanol.

This invention separately provides a method for manufacturing an organic electroluminescence device in which the organic layer is a light-emitting portion.

This invention separately provides a method for manufacturing an organic electroluminescence device manufactured by the method according to the present invention. The organic layer is formed, for example, by imprinting at least one of a conductive polymer and a solution of a light-emitting polymer using inkjet printing.

This invention separately provides an organic electroluminescence device, comprising a pixel define layer (PDL), wherein the PDL defines at least one area of the organic electroluminescence device with a high surface energy and at least one area of the organic electroluminescence device with a low surface energy. This invention separately provides a method for manufacturing a substrate, comprising depositing at least one of a first insulating layer and a first pixel defining layer on a supporting substrate, and treating at least a first portion of at least one of the first insulating layer and the first pixel defining layer, and treating a second portion of the first portion of at least one of the first insulating layer and the first pixel defining layer. These and other features and advantages of this invention are described in, or are apparent from, the following detailed description of various exemplary embodiments of the systems and methods according to this invention.

BRIEF DESCRIPTION OF THE DRAWINGS

Various features and advantages of the present invention will be described with reference to the following figures.

DETAILED DESCRIPTION OF THE INVENTION

Figure 1:
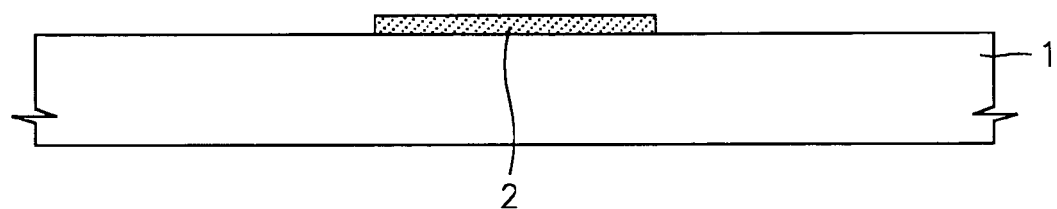
FIG. 1 is a diagram of a non-treated substrate surface.

This invention provides a method for manufacturing a substrate having a single coating and a plurality of surface energies which can be manufactured using commercially available materials and with cost-saving methods.

A first photo-resist coating material is deposited onto a supporting substrate to form a first photo-resist coating layer. The first photo-resist coating material may, for example, be a commercially available photo-resist, such as, for example a Novolak based photo-resist, acrylic lacquer, epoxy lacquer or polyimide lacquer. The photo-resist coating layer is exposed with a photo mask and then developed. The first coating layer is thermally cross-linked and surface treated such that at least a portion of the first coating layer has a high surface energy. The surface treatment may be, for example, an UV-ozone treatment or an oxygen plasma treatment.

Thereafter, a second photo-resist coating layer is formed. The second photo-resist coating layer may be, for example, a commercially available photo-resist. The second photo-resist coating layer is exposed with a photo mask and then developed. The second photo-resist coating layer overlaps at least a portion of the first photo-resist coating layer. The surface of the substrate is treated such that the surface energy of the substrate surface is lowered. For example, the surface energy of the exposed first photo-resist coating layer (i.e., the portion of the first photo-resist coating layer which is not overlapped with the second photo-resist coating layer) and the surface energy of the second photo-resist coating layer are lowered. To lower the surface energy of the substrate, the substrate surface is treated, for example, with a fluorine gas mixture such as, for example, $CF_4$, $SF_6$ or $NF_3$.

The surface energy can also be lowered by a plasma treatment using, for example, a gas mixture of tetrafluoromethane and oxygen mixed in a volume ratio of 4:1. The second photo-resist coating layer is then removed. The second photo-resist coating layer may be removed with, for example, an organic solvent such as acetone, tetrahydrofuran or the mixtures thereof. By suitably selecting photo masks and surface treatments, a first photo-resist coating layer can be made to have a desired geometry and a desired contrast of surface energies.

Thus, according to the features of this invention, a substrate with a plurality of surface energies can be manufactured that has a single coating. Although a second coating layer is used to manufacture the substrate, the second coating layer may be removed such that the formed substrate has a single coating layer. Thus, a substrate with a high-contrast energy and with only one coating may be manufactured according to the features of this invention. According to the features of this invention, it is possible to only use organic materials for coating build-up. According to this method, a high contrast in surface energy can be obtained with a low coating thickness.

A supporting substrate can be made, for example, of glass, plastic, silicon or other flexible or rigid materials. The coating layer may consist, for example, of a photo-resist which is exposed using a photo mask and then developed. In this case, a commercially available photo-resist can be used as the photoresist. As discussed above, structuring of a polymer layer can be made by etching the polymer layer using a photo-resist mask. The surface energy can be lowered, for example, by means of a suitable UV-ozone or oxygen plasma treatment, respectively.

The substrate according to the invention can be used, for example, for forming organic layers of an organic electroluminescence device. Materials for forming such organic layers are not particularly limited, but preferred examples thereof include conductive polymer, light-emitting materials, such as, for example, light-emitting polymers, and mixtures thereof. The substrate according to the invention can be used, for example, for imprinting a conductive polymer and/or for imprinting a solution of light-emitting polymers by means of an inkjet printing system.

The conductive polymer may comprise, for example, polyethylene dioxothiophene-polystyrene sulfone acid (PEDT-PSS), polyaniline or a mixture thereof. A surface tension of the conductive polymer can be reduced by means of suitable additives, such as, for example, a surfactant or a lower alcohol, such as, for example, butanol or propanol. The polymer coating separated in this way is dried by a thermal treatment.

The light-emitting polymers may be derived, for example, from polyphenylenvinylenes (PPVs) or polyfluorenes or a mixture thereof.

In an inkjet printing process to be described later, the first step is imprinting of a solution containing a suitable conductive polymer. The coating of the conductive polymer serves to improve injection of defect electrons (holes) into a light-emitting material. The coating layer also planarizes an anode coating layer (indium-tin-oxide), thereby preventing the life of an OLED from being shortened due to unevenness.

Solutions of light-emitting polymers, such as, for example, solutions from the polyphenylenvinylenes (PPVs) and the polyfluorenes (PFOs), are imprinted by an inkjet printing 5 method. Thereafter, deposition of a metallic cathode coating layer is performed by means of vacuum evaporation/sputtering, followed by encapsulation.

As shown in FIG. 1, a rigid or flexible supporting substrate 1 made of glass, silicon or another material is used. A light-emitting polymer (LEP) is to be imprinted later onto a certain area 2, a so-called active pixel surface.

To avoid color mixing, which is the mixing of polymers of different colors and to be able to individually activate the polymers for the purpose of producing a picture a polymer should be deposited on a predetermined portion of the substrate 1.

Figure 2:
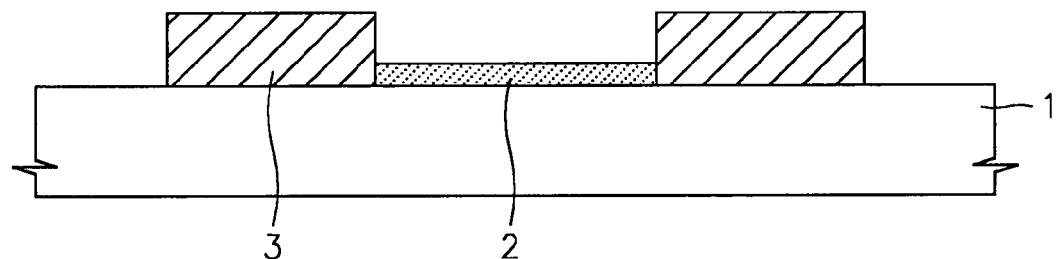
FIG. 2 shows a substrate surface having a first photo-resist coating layer.

A first photo-resist coating material is applied onto the supporting substrate 1 by spin-coating. The applied first photo-resist coating material is exposed using a photo mask. The applied and exposed first photo-resist coating material is then developed, thermally treated, and UV-ozone and/or an oxygen-plasma treated. The treated substrate is shown in FIG. 2. A photo-resist coating layer 3 with a high surface energy is formed by the UV-ozone and/or the oxygen-plasma treatment.

Figure 3:
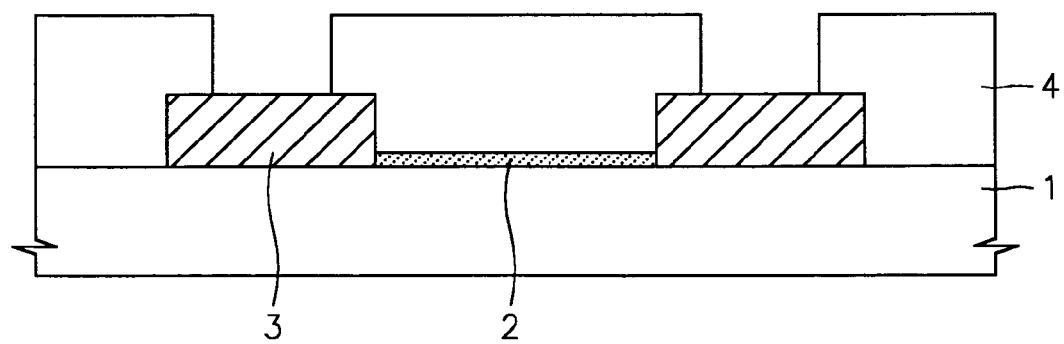
FIG. 3 shows a substrate surface having a first coating layer, a second coating layer and a partially overlaid photo-resist coating layer (each exposed and developed).

Then, as shown in FIG. 3, a second photo-resist coating material is applied onto the resultant structure by spin-coating, followed by exposure and development using a photo mask, thereby forming a second photo-resist coating layer 4. The second photo-resist coating layer overlaps boundary zones of the first photo-resist coating layer 3. Next, the substrate 1 is subjected to a plasma treatment with a fluorine-containing gas mixture. In particular, $CF_4$, $SF_6$ and $NF_3$ are appropriate fluorine gases. As a result, a particular part of the first photo-resist coating layer 3, which is not covered by the second photo-resist coating layer 4, is provided with a low surface energy. However, a part of the first coating 3, overlaid by the second coating 4, retains its comparatively high surface energy.

Figure 4:
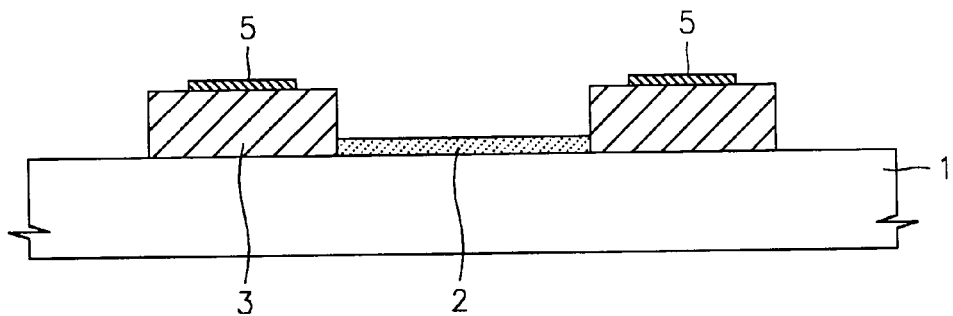
FIG. 4 shows a substrate surface subjected to a treatment for reducing a surface energy and a treatment for removing the second photo-resist coating layer.

The second photo-resist coating layer 4 is removed by a suitable solvent such as acetone, tetrahydrofuran or the mixtures thereof. A surface of the resulting substrate is shown in FIG. 4, showing a partial photo-resist coating layer with areas of a high surface energy, that is, the particular part of the first photo-resist coating 3, and areas of a low surface energy, that is, portions indicated by reference numeral 5. The geometry of these areas can be arranged at random by means of a suitable selection of a photo mask. The ratio of a surface energy of the areas 3 to that of the areas 5 can also be advantageously arranged by means of a suitable UV-ozone and/or oxygen-plasma treatment.

Figure 5:
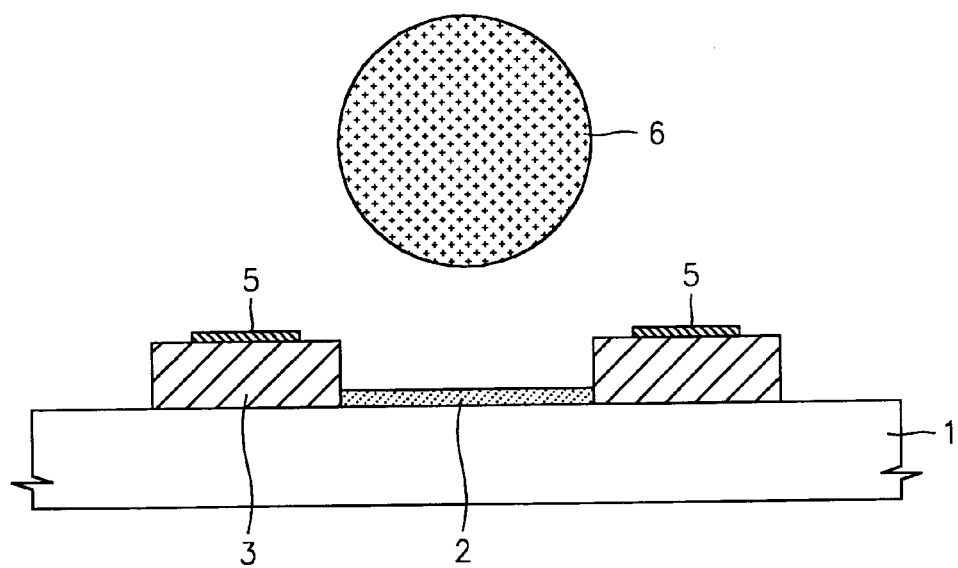
FIG. 5 shows a treated substrate surface with an ink drop above the same.

FIG. 5 shows a photo-resist coating treated with an ink drop 6 disposed above the photo-resist coating and made of a light-emitting semi-conducting polymer (LEP). The ink drop flows in an area of the active pixel surface 2 and in boundary zones of the photo-resist coating 3 with high surface energy.

As the surface energy transitions from a high state to a low state outside the active pixel surface 2, a substantially uniform coating thickness is ensured over the active pixel surface 2. A substantially uniform coating is ensured because a decay of the coating thickness in the boundary zones of the active pixel surface 2 will not take place as this decay will only occur in the vicinity of the areas 5 with a low surface energy. In this way, a homogeneous pattern of the polymer film is ensured.

Figure 6:
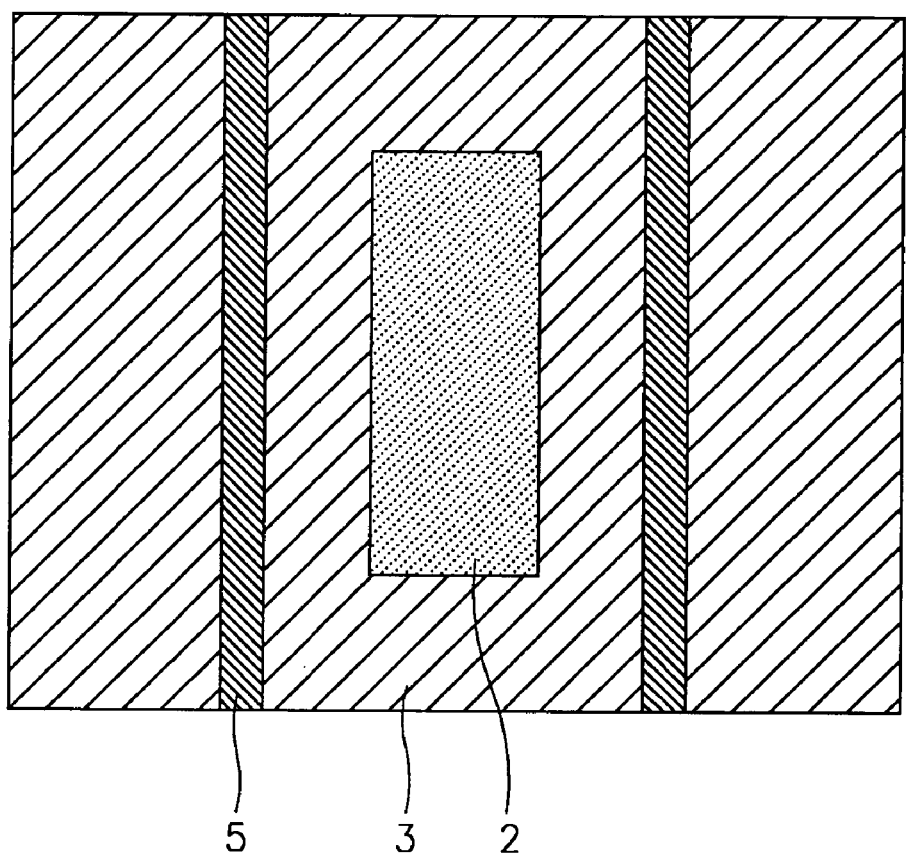
FIG. 6 is a top view of a substrate for an organic light-emitting element with an already applied ink drop.

FIG. 6 is a top view of a substrate for an organic light-emitting element after inkjet printing. Here, the active pixel surface 2 and the areas of the photo-resist coating 3 with a high surface energy are wetted with ink. In contrast, the area 5 with a low surface energy is not wetted by ink.

In an exemplary embodiment of a method for forming a substrate according the this invention, glass with a pre-structured indium-tin-oxide coating, for example, is used as a supporting substrate. A first photo-resist coating material, such as, for example, a Novolak based photo-resist, e.g., JEM 750 of Messrs JSR (Japan Synthetic Rubber), is applied, for example, by spin-coating to a thickness of about 500 nm, and then exposed using a suitable photo mask. After development, the resulting structure is thermally treated at about 200° C. for about one hour.

Subsequently, the thermally treated resulting structure is treated in oxygen plasma, for example, for about 120 seconds, thereby forming a first photo-resist coating layer. Thereafter, a second photo-resist coating material is applied onto the resulting structure by spin-coating. The second photo-resist coating material may, for example, be a Novolak based photo-resist, e.g., AZ6612 of Messrs Clariant. The resulting structure is exposed using a suitable photo mask and developed.

The resulting substrate, in this exemplary embodiment, is subjected to an oxygen plasma treatment for subsequent treatment. For example, the resulting substrate is plasma treated using, for example, a gas mixture of tetrafluorine methane-oxygen in the volume ratio of about 4:1 for about 120 seconds. The second photo-resist coating layer is removed, preferably immediately after the plasma treatment, by a suitable solvent, such as, for example, acetone, tetrahydrofuran or the mixtures thereof.

In this exemplary embodiment, the area 5 with the low surface energy, which acts as a separator zone is, for example, preferably approximately 10–20 $\mu$m wide. An interim space in the active pixel area 2 is, for example, approximately 30 $\mu$m, which corresponds to a resolution of approximately 130 PPI. The surface energy of the area 3 with a high surface energy is, for example, approximately 60–70 dyne/cm, while the surface energy of the area with a low surface energy is, for example, approximately 20–35 dyne/cm.

Figure 7:
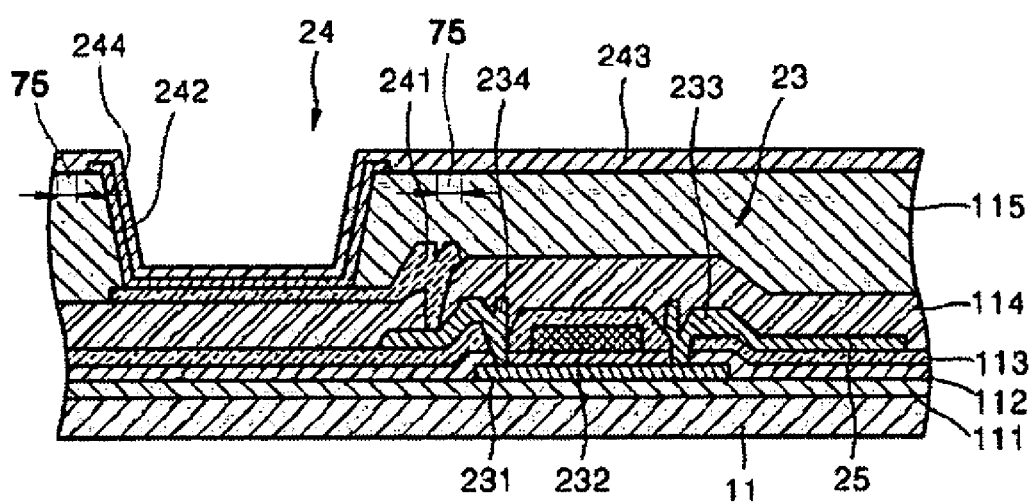
FIG. 7 shows a laminated structure of an organic electroluminescence device according to an embodiment of this invention.

FIG. 7 shows a laminated structure of an active matrix type organic electroluminescence device according to an embodiment of the present invention. As shown in FIG. 7, a buffer layer 111 made of $SiO_2$ is formed on an insulating substrate 11, and a TFT 23 and an EL device 24 are provided on the buffer layer 111.

The TFT 23 includes a semiconductor active layer 231 made of, for example, amorphous silicon or polycrystalline silicon formed on the buffer layer 111. The semiconductor active layer 231 has a source region and a drain region, which are doped with high-concentration N-type or P-type impurities. A gate insulating layer 112 is provided on the semiconductor active layer 231 and a gate electrode 232 is provided on the insulating layer 112. The gate electrode 232 is connected to an electrode (not shown) of a capacitor (not shown) to supply a TFT on/off signal. A source electrode 233 is connected to a drive line 25 and supplies a reference voltage to the semiconductor active layer 231. A drain electrode 234 connects the TFT 23 with the EL device 24 and applies a drive power to the EL device 24. An interlayer insulating film 113 is provided between each of the gate electrode 232, the source electrode 233 and the drain electrode 234. A passivation film 114 is interposed between the source electrode 233 and drain electrode 234 and an anode electrode 241, which is an electrode of the EL device 24.

A pixel define layer (PDL) 115 made of acryl, for example, is formed on the anode electrode 241, and a predetermined opening 244 is formed in the PDL 115. Neighboring pixels are spaced apart from each other by the PDL 115, thereby defining a pixel area. The PDL 115 corresponds to an interlayer insulating film formed between anodes in a passive matrix type organic EL device.

Reference numeral 75 in FIG. 7 denotes a low surface energy area of the PDL 115. The low surface energy area 75 corresponds to the area represented by reference numeral 5 in FIG. 6. The remaining portion of the PDL 115 (i.e., the area not represented by reference numeral 75) denotes a high-energy area.

Areas with a high surface energy and areas with a low surface energy are defined by the PDL 115. The surface energy of an area where the PDL 115 is not formed may be either high or low. As shown in FIG. 7, at least one layer is further laminated on the PDL 115, and areas with a high surface energy and areas with a low surface energy may be provided on the surface of the layer. The PDL 115 may be, for example, a photo-resist coating layer. The same surface treatment as that for the photo-resist coating layer is applied to the PDL 115 and the layer formed on the PDL 115.

As shown in FIG. 7, a portion of the PDL 115 can be a low surface energy area 75. The remainder of the PDL 115 may be a high surface energy area.

The EL device 24 displays a predetermined image by emitting red, green or blue light according to the flow of current. The EL device 24 includes an anode electrode 241, a cathode electrode 243 and an organic emitting layer 242. The anode electrode 241 is connected to the drain electrode 234 of the TFT 23 and receives positive power from the drain electrode 234. The cathode electrode 243 covers the pixels and supplies negative power thereto. The organic emitting layer 242 is disposed between the anode electrode 241 and the cathode electrode 243 and it emits light.

The anode electrode 241 may be, for example, a transparent electrode made of ITO. In the case of a rear-surface emission type in which the device 24 emits light toward the substrate 11, the cathode electrode 243 is formed through blanket-deposition of Al/Ca, for example. In the case of a front-surface emission type in which the device 24 emits light toward a sealing member 12 opposite to and facing the substrate 11, the cathode electrode 243 is formed of a transparent material such that a thin-semi-transparent film made of Mg/Ag, for example, is formed and transparent ITO is then deposited thereon. The cathode electrode 243 may be formed through blanket-deposition, however, it may also be formed, for example, in various patterns. It should be understood that the anode 241 and the cathode 243 may be laminated in the opposite order. The organic layer 242 may be, for example, a low-molecular weight organic layer or a polymeric organic layer.

The substrate according to this invention may be manufactured at low cost and with a good contrast in surface energy (i.e., for example, a substrate with a plurality of surface energies including a high surface energy and a comparatively low surface energy) and with a reduced coating thickness, compared to conventional substrates. The substrate may be used, for example, for imprinting a conductive polymer and/or for imprinting a solution of light-emitting polymers by means of an inkjet printing system.

In the above description of various exemplary embodiments according to the present invention, the first photo-resist coating material is treated to have a high surface energy area and the second photo-resist coating material is treated to have a low surface energy area. However, it should be appreciated that it is possible, for example, to treat the first photo-resist coating material to have a low surface energy area and to treat the second photo-resist coating material to have a high surface energy in accordance with the features of this invention.

The invention is not limited to the embodiments presented and illustrated here. Moreover, it is possible to realize further embodiment variants by means of combination and modification of the stated means and features, without departing from the framework of the invention.

What is claimed is:

1. A substrate having a non-continuous photo-resist coating layer, an insulating layer and a pixel defining layer formed on at least one surface of a supporting substrate, wherein the non-continuous photo-resist coating layer, insulating layer and pixel defining layer comprises a plurality of continuous portions, and the plurality of continuous portions comprise:
   at least one high surface energy area; and
   at least one low surface energy area, wherein at least one of a second photo-resist coating layer and a mask is used to at least temporarily overlap the continuous portion corresponding to the at least one high surface energy area in order to form the at least one low surface energy area.

2. The substrate of claim 1, wherein the high surface energy areas have a surface energy of about 60–70 dyne/cm and the low surface energy areas have a surface energy of about 20–35 dyne/cm.

3. The substrate of claim 1, wherein the supporting substrate is rigid.

4. The substrate of claim 1, wherein the supporting substrate is flexible.

5. The substrate of claim 1, wherein the supporting substrate is made of at least one of glass, plastic and silicon.

6. The substrate of claim 1, wherein the non-continuous photo-resist coating material is at least one of a Novolak based photo-resist, acrylic lacquer, epoxy lacquer and polyimide lacquer.

7. An organic electroluminescence device, comprising:
   a pixel defining layer (PDL) patterned to expose an active pixel surface portion of a substrate on which the PDL is formed,
   wherein the PDL includes a high surface energy area and a low surface energy area, the high surface energy area being disposed between the active pixel surface portion and the low surface energy area to prevent a decay of a coating thickness in a boundary zone of the active pixel surface portion.

8. The organic electroluminescence device according to claim 7, wherein a surface energy of the active pixel surface portion is high.

9. The organic electroluminescence device according to claim 7, wherein at least one layer is provided on the PDL, and a surface of the layer includes at least one area with a high surface energy and at least one area with a low surface energy.

10. The organic electroluminescence device according to claim 7, wherein the PDL is a photo-resist coating layer.

11. The organic electroluminescence device according to claim 7, further comprising:
    a homogeneous pattern of polymer film formed over the active pixel surface portion and the high surface energy portions of the PDL.

12. The organic electroluminescence device according to claim 11, wherein the polymer film comprises a light-emitting semi-conducting polymer (LEP).

* * * * *